United States Patent
Jung et al.

(10) Patent No.: US 10,991,412 B2
(45) Date of Patent: Apr. 27, 2021

(54) STORAGE DEVICE AND METHOD FOR OPERATING STORAGE DEVICE

(71) Applicant: Samsung Electronics Co., Ltd., Suwon-si (KR)

(72) Inventors: Sang Won Jung, Busan (KR); Shin Ho Oh, Yongin-si (KR); Dong Hoon Ham, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/030,766

(22) Filed: Sep. 24, 2020

(65) Prior Publication Data

US 2021/0012830 A1 Jan. 14, 2021

Related U.S. Application Data

(62) Division of application No. 16/391,973, filed on Apr. 23, 2019, now Pat. No. 10,811,074.

(30) Foreign Application Priority Data

Aug. 2, 2018 (KR) .................... 10-2018-0090421

(51) Int. Cl.
| | |
|---|---|
| *G11C 11/40* | (2006.01) |
| *G11C 11/406* | (2006.01) |
| *G06F 3/06* | (2006.01) |
| *G11C 5/00* | (2006.01) |
| *G11C 29/00* | (2006.01) |

(52) U.S. Cl.
CPC ........ *G11C 11/40603* (2013.01); *G06F 3/064* (2013.01); *G06F 3/0629* (2013.01); *G06F 3/0679* (2013.01); *G06F 3/0619* (2013.01); *G11C 5/005* (2013.01); *G11C 11/40626* (2013.01); *G11C 29/00* (2013.01)

(58) Field of Classification Search
CPC ..... G11C 11/4063; G11C 5/005; G11C 29/00; G11C 11/40626
See application file for complete search history.

(56) References Cited

U.S. PATENT DOCUMENTS

| | | |
|---|---|---|
| 8,675,406 B2 | 3/2014 | Lee et al. |
| 8,949,555 B1 | 2/2015 | Karamcheti et al. |
| 9,025,405 B2 | 5/2015 | Jeong |
| 9,129,699 B2 | 9/2015 | Suzuki et al. |
| 9,135,166 B1 | 9/2015 | Syu et al. |
| 9,430,339 B1 | 8/2016 | Song |
| 9,431,113 B2 | 8/2016 | Fitzpatrick et al. |
| 9,646,067 B2 | 5/2017 | Abercrombie et al. |
| 9,852,799 B2 | 12/2017 | Peterson et al. |

(Continued)

*Primary Examiner* — Han Yang
(74) *Attorney, Agent, or Firm* — Harness, Dickey & Pierce, P.L.C.

(57) ABSTRACT

A storage device may include a monitoring module which monitors a characteristic degradation rate of a plurality of blocks included in a cell array of a nonvolatile memory; a group management module which designates the plurality of blocks as one or more groups, on the basis of a monitoring result of the monitoring module; a refresh period management module which determines refresh periods for each of the one or more groups; and a processor which performs refresh on the one or more groups in accordance with the determined refresh periods.

11 Claims, 17 Drawing Sheets

(56) References Cited

U.S. PATENT DOCUMENTS

2014/0043927 A1* 2/2014 Franceschini ........ G11C 29/028
                                                      365/201
2015/0113207 A1    4/2015 Shin
2016/0224247 A1*  8/2016 Woo ........................ G06F 3/061
2018/0374546 A1  12/2018 Shi et al.
2019/0278706 A1   9/2019 Hong et al.

* cited by examiner

FIG. 11

PERIOD = 3

| G1 | B11 | B12 | B13 | B14 | B15 |

PERIOD = 5

| G2 | B21 | B22 | B23 | B24 | B25 | B26 | B27 | B28 |

PERIOD = 7

| G3 | B31 | B32 | B33 | B34 | B35 | B36 | B37 | B38 | B39 | B40 | B41 |

600

| MODE | REFRESH PERIOD POLICY |
|---|---|
| 1 | 1 GROUP WITH PERIOD '1' |
| 2 | 2 GROUPS WITH PERIOD '3', '7' |
| 3 | 3 GROUPS WITH PERIOD '2', '4', '6' |
| 4 | 5 GROUPS WITH PERIOD '1', '3', '5', '7', '9' |

STORAGE DEVICE AND METHOD FOR OPERATING STORAGE DEVICE

CROSS-REFERENCE TO RELATED APPLICATION

This application is a divisional application of U.S. application Ser. No. 16/391,973, filed on Apr. 23, 2019, which claims priority from Korean Patent Application No. 10-2018-0090421 filed on Aug. 2, 2018, in the Korean Intellectual Property Office, the entire disclosure of each of which is incorporated herein by reference in its entirety.

BACKGROUND

1. Field of the Disclosure

At least some example embodiments relate to a storage device and/or a method for operating the storage device.

2. Description of the Related Art

Various flash memory-based storage devices perform various data operations on memory cells. For example, after receiving commands for reading or writing data from a host, the storage device may perform various data operations such as read, write, program and erase to process the commands.

However, when a certain period of time elapses after a write operation, degradation of characteristics (for example, retention characteristics) of a NAND constituting the flash memory occurs. In order to compensate for the degradation of the characteristics in such a case, a refresh operation may be executed by moving the data written in the block in which the characteristic degradation occurs to another block, performing an erase operation on the block in which the characteristic degradation occurs, and then executing a write operation on the block again.

However, the refresh operation may degrade the performance of the storage device. For example, in the case where the refresh operations simultaneously and frequently occur on a large number of blocks, since the storage device not only has difficulty in quickly processing the user's request, but also causes a deviation in performance, it may be difficult to secure the stability of the storage device.

SUMMARY

Some example embodiments of the present disclosure provide a storage device capable of reducing the overhead caused by a refresh operation used to reduce characteristic degradation of a block.

Some example embodiments of the present disclosure also provide a method for operating a storage device capable of reducing overhead caused by a refresh operation used to reduce characteristic degradation of a block.

According to an example embodiment of the present disclosure, there is provided a storage device including processing circuitry configured to, monitor a characteristic degradation rate of a plurality of blocks included in a cell array of a nonvolatile memory to generate a monitoring result, designate the plurality of blocks as one or more groups based on the monitoring result, determine refresh periods for each of the one or more groups, and refresh the one or more groups in accordance with the refresh periods.

According to another example embodiment of the present disclosure, there is provided a storage device including processing circuitry configured to, designate a plurality of blocks included in a cell array of a nonvolatile memory as one or more groups based on a difference in characteristic degradation rates, the characteristic degradation rates indicating degrees of degradation of retention characteristics of the plurality of blocks, determine refresh periods for each of the one or more groups, refresh the one or more groups based on the refresh periods, and execute a block status check for each of the one or more groups.

According to still another example embodiment of the present disclosure, there is provided a method for operating a storage device including monitoring characteristic degradation rates of a plurality of blocks included in a cell array of a nonvolatile memory; designating the plurality of blocks as one or more groups on the basis of the monitoring result; determining refresh periods for each of the one or more groups; and performing refresh on the one or more groups in accordance with the determined refresh periods.

However, example embodiments of the present disclosure are not restricted to the one set forth herein. The above and other example embodiments of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail some example embodiments thereof with reference to the attached drawings, in which:

FIG. 11 is a diagram for explaining an operation example of the storage device according to the example embodiment of the present disclosure of FIG. 1;

DETAILED DESCRIPTION

Figure 1:
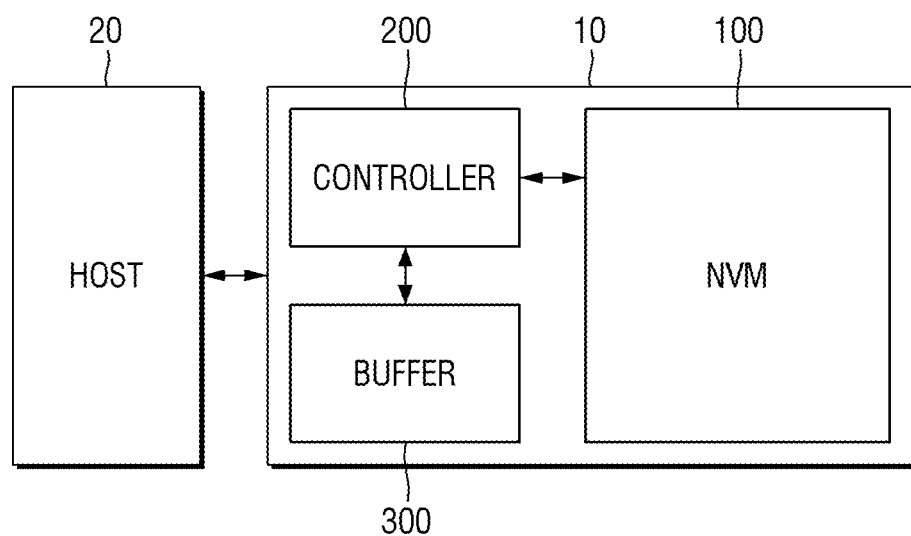
FIG. 1 is a block diagram for explaining a storage device according to an example embodiment of the present disclosure.

FIG. 1 is a block diagram for explaining a storage device according to an example embodiment of the present disclosure.

Referring to FIG. 1, a storage device 10 according to an example embodiment of the present disclosure includes a nonvolatile memory 100, a controller 200, and a buffer 300.

The storage device 10 may receive a read or write request from the host 20. The storage device 10 may further include an interface for transmitting the request from the host 20 to the controller 200 or for providing the data provided from the controller 200 to the host 20.

The controller 200 may access the nonvolatile memory 100 in response to a read or write request from the host 20. For example, the controller 200 may read the data stored in the nonvolatile memory 100 as a response to the read request and provide the data to the host 20. Further, as a response to the write request, the controller 200 may program the data provided from the host 20 to the nonvolatile memory 100. Further, the controller 200 may also perform an erase operation on the nonvolatile memory 100.

The controller 200 may include a flash translation layer (FTL). The flash translation layer may be used to translate a logical address to a physical address. For example, the controller 200 may convert the logical address related to the read or write request received from the host 20 into the physical address of the nonvolatile memory 100, using the flash translation layer. To this end, the controller 200 may also manage an address mapping table that stores a mapping relation between the logical address and the physical address.

The buffer 300 may include a memory used by the controller 200 to access the nonvolatile memory 100 and process the request of the host 20. In some example embodiments of the present disclosure, the buffer 300 may include a static random access memory (SRAM), but the scope of the present disclosure is not limited thereto.

Figure 2:
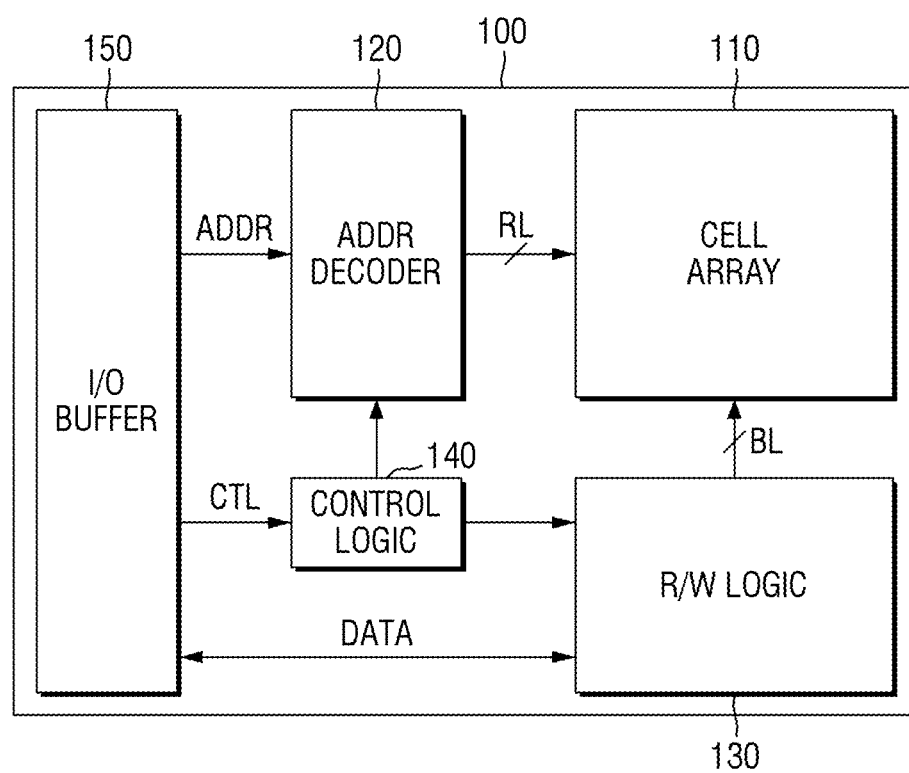
FIG. 2 is a block diagram for explaining a nonvolatile memory of the storage device of FIG. 1.

Referring now to FIG. 2, the nonvolatile memory 100 will be described in more detail.

FIG. 2 is a block diagram for explaining a nonvolatile memory of the storage device of FIG. 1.

Referring to FIG. 2, the nonvolatile memory 100 includes a cell array 110, an address decoder 120, a read/write logic 130, a control logic 140 and an input/output buffer (I/O buffer) 150.

The cell array 110 is connected to the address decoder 120 via a row line RL, and is connected to the read/write logic 130 via a bit line BL. Here, the row line includes a plurality of string selection lines, a plurality of word lines, a plurality of ground selection lines, and the like.

The address decoder 120 is connected to the cell array 110, the control logic 140 and the I/O buffer 150. The address decoder 120 receives the address ADDR via the I/O buffer 150 and decodes the received address ADDR under the control of the control logic 140. For example, the address decoder 120 decodes the received address ADDR to acquire the block address, and may access the memory block of the cell array 110, using the block address.

The address decoder 120 may further include a row decoder. The address decoder 120 may acquire the row address by decoding the received address ADDR using the row decoder, and may select one of a plurality of word lines in blocks selected in the cell array 110 using the row address.

Also, the address decoder 120 may further include a column decoder. The address decoder 120 may obtain the column address by decoding the received address ADDR using the column decoder, and may transmit the column address to the read/write logic 130.

The read/write logic 130 is connected to the cell array 110 via the bit line BL and receives the column address decoded by the address decoder 120. The read/write logic 130 selects the bit line BL, using the decoded column address under the control of the control logic 140.

For example, the read/write logic 130 may program data DATA received via the I/O buffer 150 on the memory cells corresponding to a selected word line in the cell array 110. On the other hand, the read/write logic 130 may read the data DATA corresponding to the decoded column address in the cell array 110 and may transmit the data to the I/O buffer 150. Further, the read/write logic 130 may also execute a copy-back operation of writing the data which is read from one region of the cell array 110 to another region.

The read/write logic 130 may include elements such as a page buffer, a page register, a column selection circuit, a sense amplifier, and a write driver.

The control logic 140 is connected to the address decoder 120, the read/write circuit 130 and the I/O buffer 150. The control logic 140 may control the overall operation of the nonvolatile memory 100 in accordance with a control signal CTL which is externally provided.

The I/O buffer 150 is connected to the address decoder 120, the control logic 140 and the read/write circuit 130. The I/O buffer 150 may transmit the address ADDR and the control signal CTL provided from the outside to the address decoder 120 and the control logic 140, respectively.

Further, the I/O buffer 150 may transmit the data DATA received together with the write request from the host 20 to the read/write circuit 130, or may transfer the data DATA which is read from the cell array 110 by the read/write circuit 130, for example, to the host 20.

Figure 3:
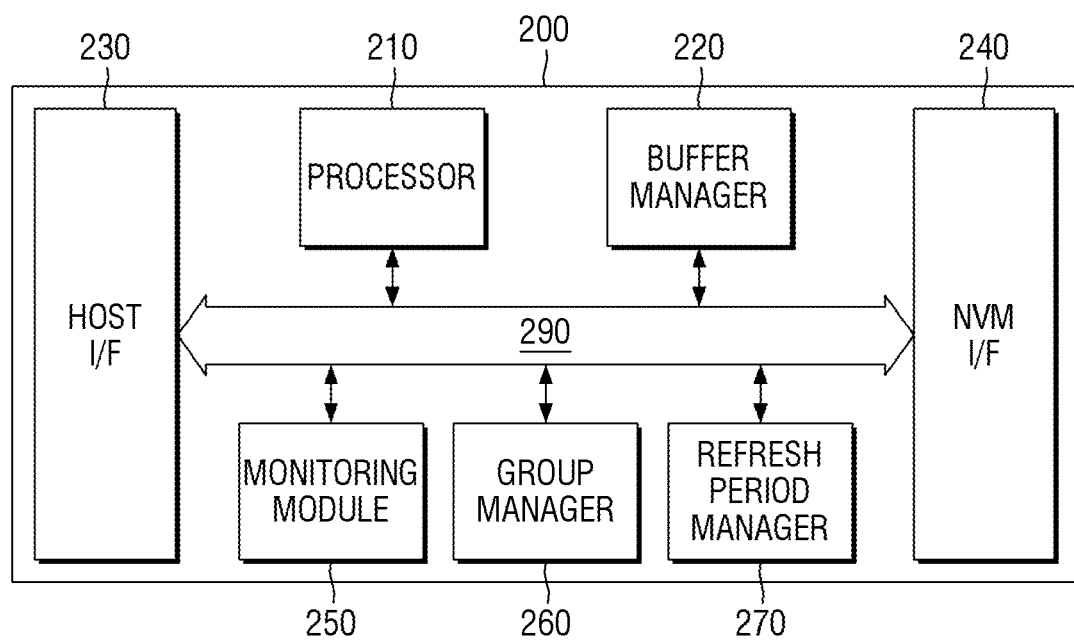
FIG. 3 is a block diagram for explaining a controller of the storage device of FIG. 1.

Referring now to FIG. 3, the controller 200 will be described in more detail.

FIG. 3 is a block diagram for explaining the controller of the storage device of FIG. 1.

Referring to FIG. 3, the controller 200 includes a processor 210, a buffer management module 220, a host interface 230 and a nonvolatile memory interface 240.

The processor 210, the buffer management module 220, the host interface 230 and the nonvolatile memory interface 240 form electrical connections with each other via a bus 290.

The processor 210 controls the overall operation of the controller 200. For example, the processor 210 may execute software (e.g., firmware) for controlling the overall operation of the controller 200. In some example embodiments of the disclosure, the processor 210 may be a CPU (Central Processing Unit). However, the scope of the present disclosure is not limited thereto, and the processor 210 may be implemented as any other type of processor capable of executing software.

The buffer management module 220 controls the buffer 300 described above in FIG. 1. For example, the buffer management module 200 may write data to the buffer 300 or read data from the buffer 300 under the control of the processor 210.

The host interface 230 implements the electrical connection between the host 20 and the controller 200 of the storage device 10. For example, the controller 200 may receive a read or write request from the host 20 via the host interface 230 and provide the result of processing the request to the host 20.

The nonvolatile memory interface 240 implements an electrical connection between the controller 200 and the nonvolatile memory 100 in the storage device 10. For example, the controller 200 may access the nonvolatile memory 100 via the nonvolatile memory interface 240 and may receive the data stored in the nonvolatile memory 100.

In some example embodiments, the nonvolatile memory 100 may be a NAND type flash memory. In this case, after a certain period of time elapses after writing the data on the nonvolatile memory 100, degradation of characteristics (for example, retention characteristics) of the NAND constituting the nonvolatile memory 100 may occur. In order to compensate for such degradation of characteristics, a refresh operation may be executed to move data written in the block in which the characteristic degradation occurs in the nonvolatile memory 100 to another block, perform an erase operation on a block in which characteristic degradation occurs, and then, execute an write operation again.

However, when the refresh operation occurs in bursts, the overhead due to the refresh operation increases, and the performance degradation of the storage device 10 may occur. For example, when the storage device 10 is executing the burst refresh operation, the storage device 10 may be difficult to normally process the data access request from the user.

In order to solve such a problem, the controller 200 according to at least some example embodiment further includes a monitoring module 250, a group management module 260 and a refresh period management module 270.

The monitoring module 250, the group management module 260, and the refresh period management module 270 form an electrical connection with each other via the bus 290, and further form an electrical connection with the processor 210, the buffer management module 220, the host interface 230 and the nonvolatile memory interface 240.

The monitoring module 250 monitors a characteristic degradation rate of the plurality of blocks included in the cell array 110 of the nonvolatile memory 100. Here, the characteristic degradation rate of the block means a degradation rate (a speed at which the characteristics degrade with the elapse of time) of the retention characteristic of a block formed of a NAND flash cell. This will be described later referring to FIGS. 4 to 6. That is, the monitoring module 250 monitors the degree of degradation of the retention characteristics of the plurality of blocks in order to monitor the characteristic degradation rate of the plurality of blocks.

The group management module 260 designates the plurality of blocks as one or more groups on the basis of the monitoring result of the monitoring module 250. That is, the group management module 260 designates a plurality of blocks as one or more groups, on the basis of the difference in characteristic degradation rate occurring between the plurality of blocks with the elapse of time.

The refresh period management module 270 determines the refresh period of each of one or more groups. Specifically, the period management module 270 determines a shorter refresh period for blocks having a higher characteristic degradation rate, and determines a longer refresh period for blocks having a lower characteristic degradation rate. Thereafter, the processor 210 refreshes one or more groups in accordance with the determined refresh period.

According to such a scheme, since the refresh operation of the block included in the cell array 110 is executed separately for each group in accordance with clear criteria, it is possible to obtain an effect of dispersing the overhead caused by the refresh operation in view of time, while stably executing the refresh operation. Therefore, in one or more example embodiments, performance degradation of the storage device 10 caused by the refresh operation may be reduced, thus providing a stable operation of the storage device 10.

Furthermore, since the time of monitoring the characteristic degradation rate of the plurality of blocks included in the cell array 110 is not limited to a specific time, even when there is a change in the operation environment of the storage device 10, during operation of the storage device 10, by monitoring the characteristic degradation rate of the plurality of blocks as necessary or periodically, it is possible to dynamically and adaptively change the refresh operation policy of the storage device 10 in the changed environment. Therefore, the effect of improving the performance of the storage device 10 may also be obtained.

In various example embodiments of the present disclosure, the monitoring module 250, the group management module 260 and the refresh period management module 270 may be implemented as software or hardware. That is, at least one of the monitoring module 250, the group management module 260 and the refresh period management module 270 may be implemented, for example, as a part of the firmware executed by the processor 210. Alternatively, at least one of the monitoring module 250, the group management module 260 and the refresh period management module 270 may be implemented as hardware such as a semiconductor circuit including a plurality of semiconductor elements.

Figure 4:
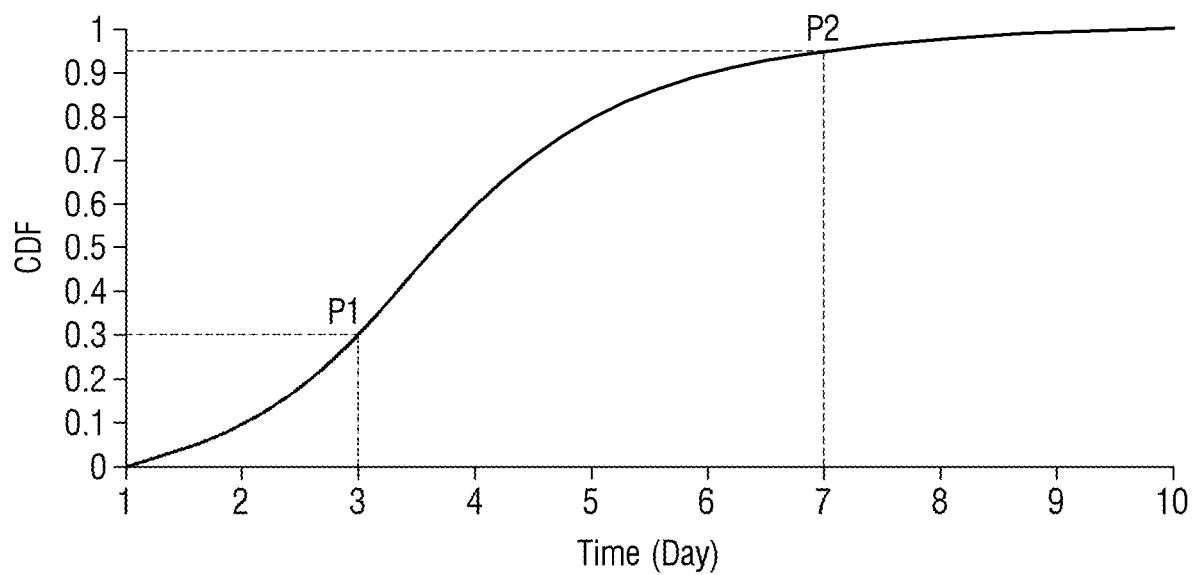
FIGS. 4 to 6 are diagrams for explaining block characteristics of the nonvolatile memory of FIG. 2.
Figure 5:
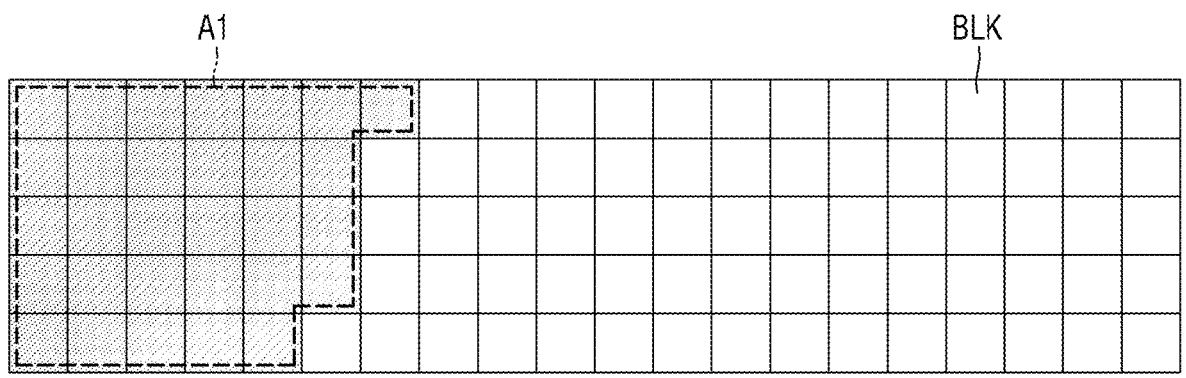
Figure 6:
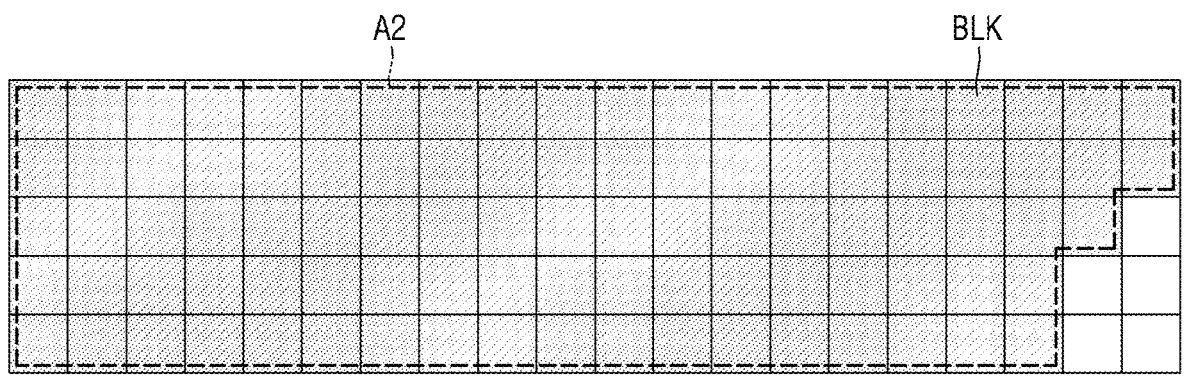

FIGS. 4 to 6 are diagrams for explaining block characteristics of the nonvolatile memory of FIG. 2.

Referring to FIG. 4, the characteristic degradation rate monitored by the monitoring module 250 may be represented by a graph in which an X axis represents an elapsed time in days and a Y axis represents a retention CDF (cumulative distribution function).

Taking a first point P1 as an example, it represents that, when three days have elapsed after execution of the write operation on the block included in the cell array 110 of the nonvolatile memory 100, the characteristics of about 30% blocks of the entire blocks of the cell array 110 are degraded.

When expressing this with schematization, as illustrated in FIG. 5, a block BLK corresponding to a region A1 corresponding to about 30% of the cell array 110 including a plurality of blocks BLK may be determined that the refresh operation needs to be executed when three days have elapsed after execution of the write operation.

On the other hand, taking a second point P2 as an example, it represents that, when seven days have elapsed after a write operation is executed on the block included in the cell array 110 of the nonvolatile memory 100, the characteristics of about 95% blocks among the entire blocks of the cell array 110 are degraded.

When expressing this with schematization, as illustrated in FIG. 6, a block BLK corresponding to a region A2 corresponding to about 95% of the cell array 110 including the plurality of blocks BLK may be determined that the refresh operation needs to be executed when seven days have elapsed after execution of the write operation.

Considering the distribution of characteristic degradation rates, for example, when refreshing is performed on the entire blocks of the cell array 110 everyday, occurrence of reclaim is significantly lowered but overhead due to refresh is very high. As another example, when refreshing the whole block of the cell array 110 every seven days, refresh overhead may be lowered, but the occurrence of reclaim may increase.

According to various example embodiments of the present disclosure, the refresh operations of blocks included in the cell array 110 are divided for each group in accordance with clear criteria, and are executed at different refresh periods, thereby acquiring a decrease in the refresh overhead and a decrease in occurrence of reclaim at the same time.

FIGS. 7 to 10 are diagrams for explaining an operation example of the storage device according to the embodiment of the present disclosure in FIG. 1.

Figure 7:
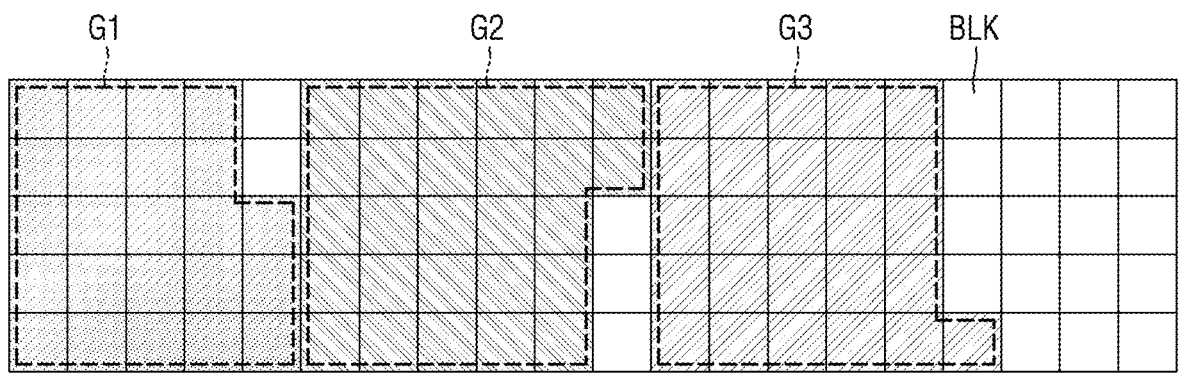
FIGS. 7 to 10 are diagrams for explaining an operation example of the storage device according to the example embodiment of the present disclosure of FIG. 1.

Referring to FIG. 7, some of the plurality of blocks BLK included in the cell array 110 may be designated as a first group G1, some others thereof may be designated as a second group G2, and still others thereof may be designated as a third group G3. That is, the group management module 260 may designate the first group G1 to the third group G3 for the plurality of blocks BLK included in the cell array 110.

The first group G1 may include a block having a characteristic degradation rate determined to be refreshed after the first time has elapsed, among the plurality of blocks BLK. For example, the first group G1 may include a block having a characteristic degradation rate determined to be refreshed after three days have elapsed from the time when the write operation was performed.

The second group G2 may include a block having a characteristic degradation rate determined to be refreshed after a second time different from the first time has elapsed, among the plurality of blocks BLK. For example, the second group G2 may include a block having a characteristic degradation rate that is determined to be refreshed after five days have passed after the time when the write operation was performed.

The third group G3 may include a block with the characteristic degradation rate determined to be refreshed after the elapse of the third time different from the first time and the second time, among the plurality of blocks BLK. For example, the third group G3 may include a block having a characteristic degradation rate determined to be refreshed after seven days have elapsed from the time when the write operation was performed.

Next, the refresh period management module 270 may determine the first refresh period on the first group G1, may determine the second refresh period on the second group G2, and may determine the third refresh period on the third group G3.

For example, the refresh period management module 270 may determine a first refresh period corresponding to three days on the first group G1, may determine a second refresh period corresponding to five days on the second group G2, and may determine the third refresh period corresponding to seventh day on the third group G3.

In particular, it should be noted that, when the characteristic degradation rate of one or more blocks designated as the first group G1 among the plurality of blocks BLK is higher than the characteristic degradation rate of one or more blocks designated as the second group among the plurality of blocks BLK, the refresh period management module 270 determines the first refresh period to be shorter than the second refresh period.

That is, if the characteristic degradation rate of the block of the first group G1 is higher than the specific decrease rate of the block of the second group G2, since it means that the speed at which the characteristic degrades with lapse of time of the block of the first group G1 is higher than the second group G2, the first refresh period is determined to be short to suppress occurrence of reclaim.

Similarly, when the characteristic degradation rate of one or more blocks designated as the second group G2 among the plurality of blocks BLK is higher than the characteristic degradation rate of one or more blocks designated as the third group G3 among the plurality of blocks BLK, the refresh period management module 270 determines the second refresh period to be shorter than the third refresh period.

In other words, if the characteristic degradation rate of the block of the second group G2 is higher than the specific decrease rate of the third group G3 block, since it means that the speed at which the characteristic degrades with lapse of time of the block of the second group G2 is higher than the third group G3, the second refresh period is determined to be short to suppress an occurrence of reclaim.

Figure 8:
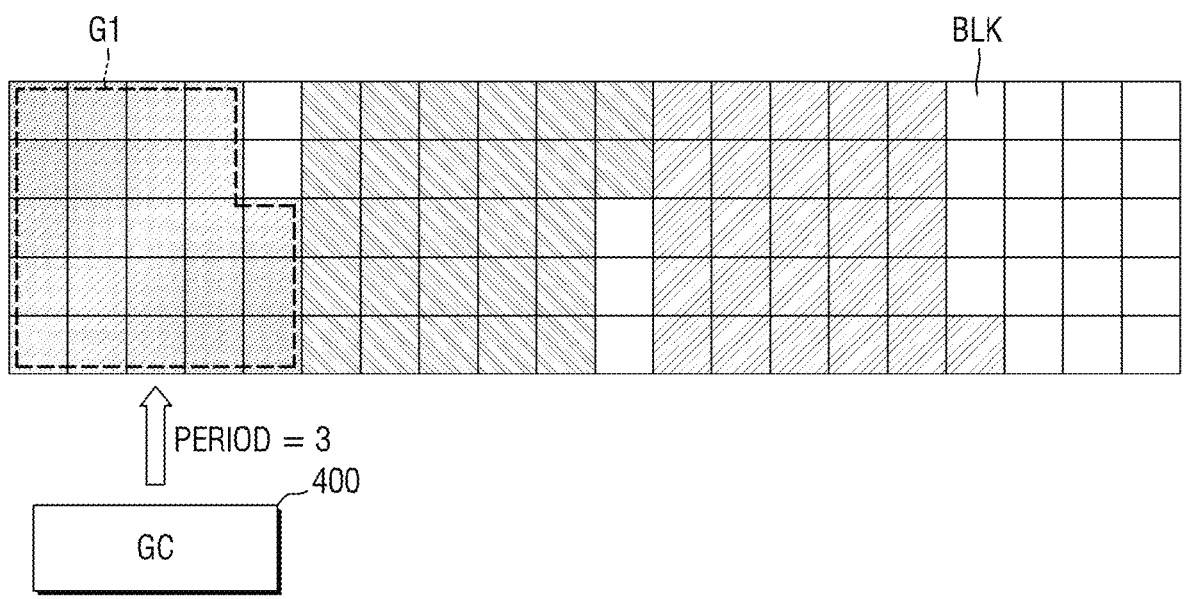

Referring now to FIG. 8, the processor 210 may refresh the first group G1 in accordance with a previously determined first refresh period, for example, using a garbage collector 400. That is, the processor 210 may refresh the first group G1 at a period of, for example, three days.

Figure 9:
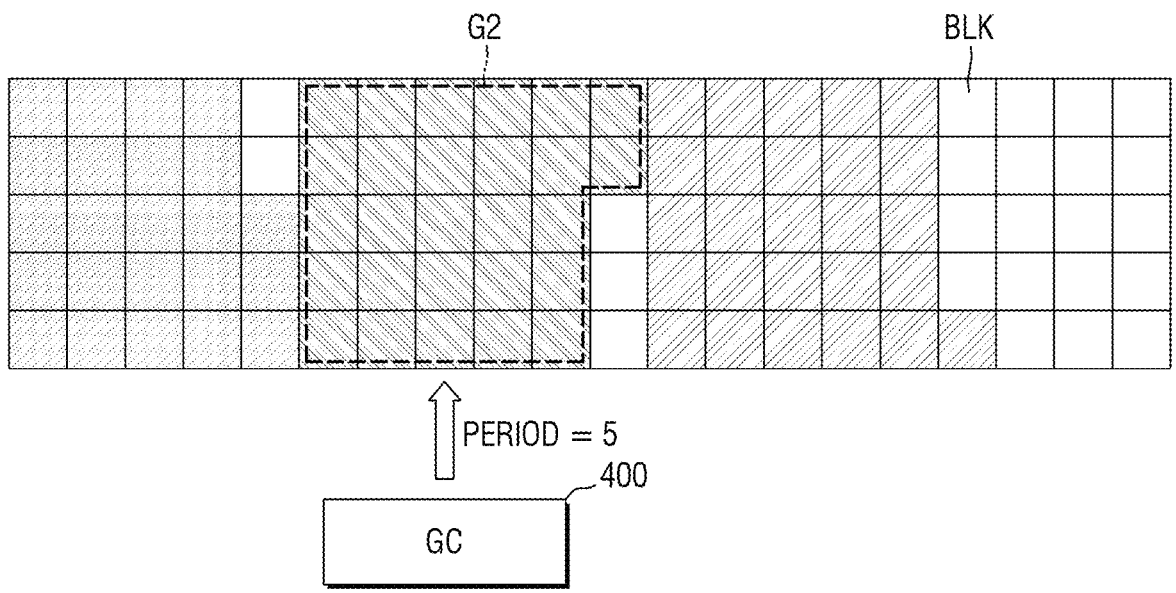

Next, referring to FIG. 9, the processor 210 may execute refresh of the second group G2 in accordance with the previously determined second refresh period, for example, using the garbage collector 400. That is, the processor 210 may refresh the second group G2, for example, in a period of five days.

Figure 10:
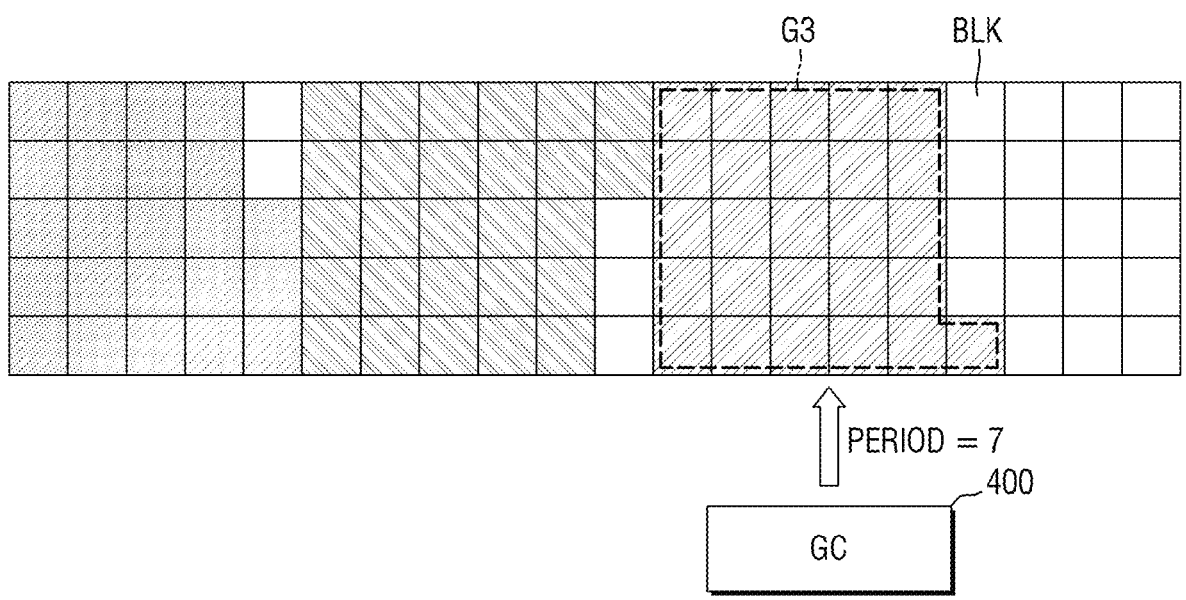

Next, referring to FIG. 10, the processor 210 may execute refresh of the third group G3 in accordance with the third refresh period determined earlier, for example, using the garbage collector 400. That is, the processor 210 may refresh the third group G3 at a period of, for example, seven days. Here, since the refresh of the first group G1 is executed at a period of three days, while the processor 210 refreshes the first group G1 once, refresh of the third group G3 may be executed about twice.

In this way, by determining a shorter refresh period for blocks with higher characteristic degradation rates, and determining a longer refresh period for blocks with lower characteristic degradation rates, thereby timely dispersing the refresh operations, it is possible to avoid degradation of the performance of the storage device 10 due to the refresh overhead and to ensure a stable operation of the storage device 10.

FIG. 11 is a diagram for explaining an operation example of the storage device according to the example embodiment of the present disclosure of FIG. 1.

Referring to FIG. 11, an example is illustrated in which the storage device 10 manages blocks classified by group.

For example, blocks B11 to B15 designated as a first group G1 having a refresh period of 3 days, blocks B21 to B28 designated as a second group G2 having a refresh period of 5 days, and the blocks B31 to B41 designated as a third group G3 having the refresh period of seven days may be managed with different data structures.

For example, the blocks B11 to B15 of the first group G1 may be implemented using any of a variety of data structures, including a stack of LIFO (Last In First Out) structure, a queue of FIFO (First In First Out) structure, and a linked list. The blocks B21 to B28 of the second group G2 and the blocks B31 to B41 of the third group G3 may also be implemented, using various data structures including a stack, a queue, and a linked list.

For the sake of convenience of explanation, in the present example embodiment, it is supposed that the blocks B11 to B15 of the first group G1, the blocks B21 to B28 of the second group G2, and the blocks B31 to B41 of the third group G3 are implemented, using queues.

As described above, after the group management module 260 designates a group, and the refresh period management module 270 determines a refresh period for each group, the processor 210 executes the refresh for each group in accordance with the refresh period.

Figure 12:
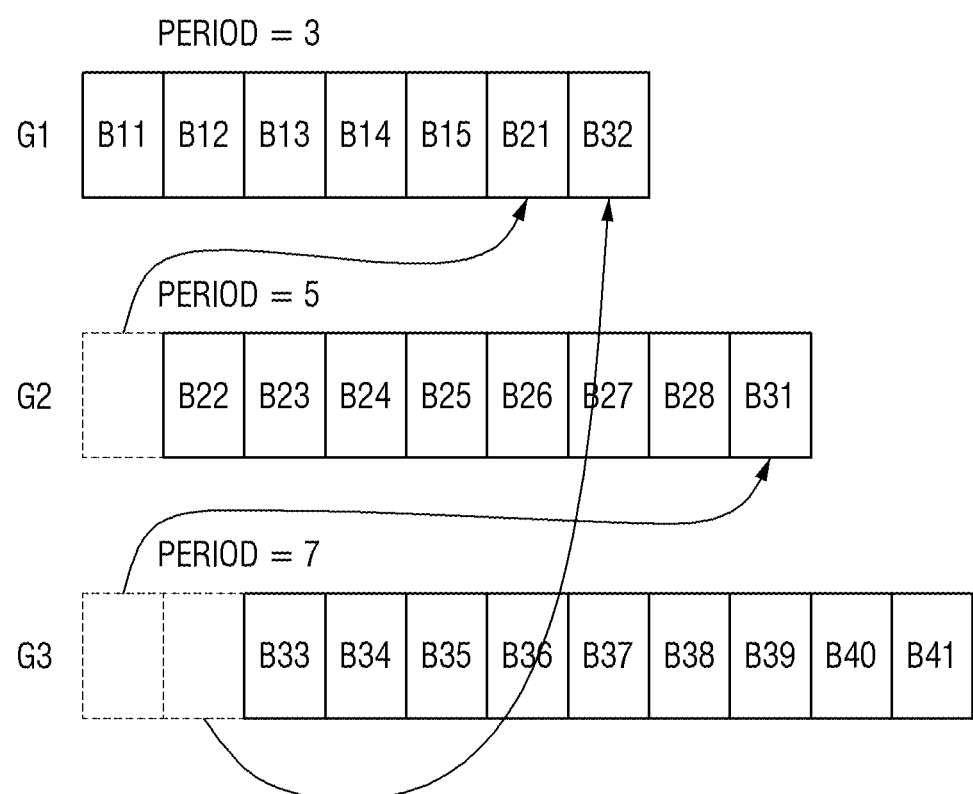
FIGS. 12 and 13 are diagrams for explaining an operation example of the storage device according to the example embodiment of the present disclosure of FIG. 1.
Figure 13:
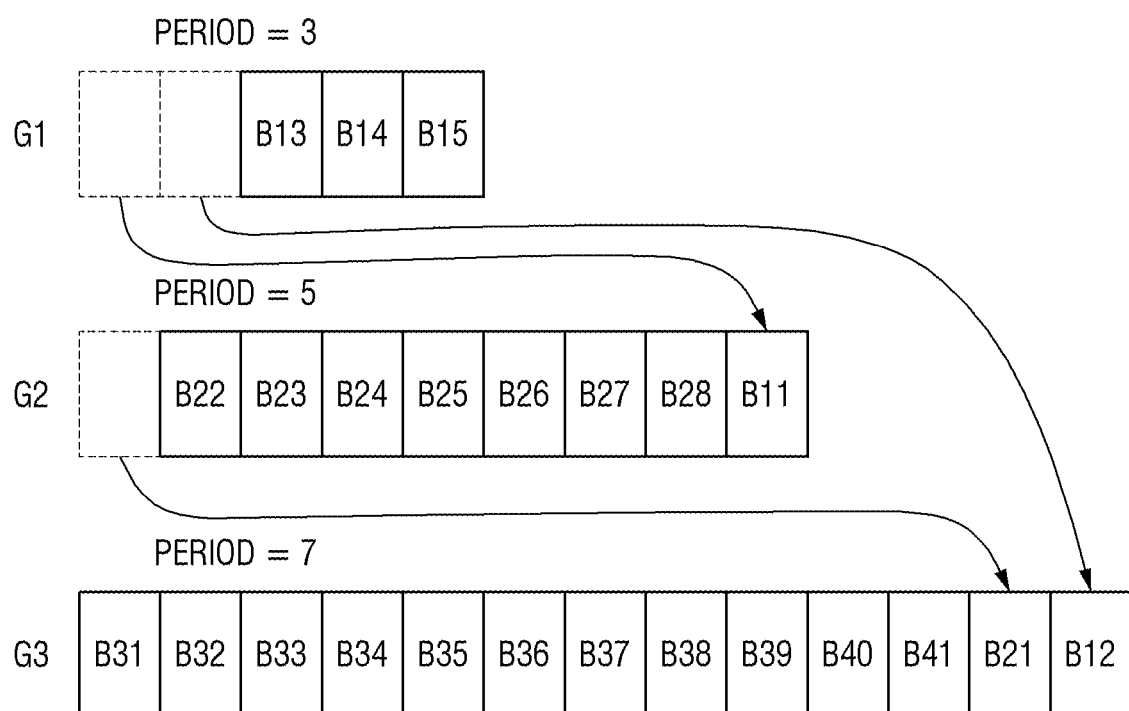

FIGS. 12 and 13 are diagrams for explaining an operation example of the storage device according to the example embodiment of the present disclosure of FIG. 1.

Referring to FIGS. 12 and 13, the refresh period management module 270 may move one or more blocks designated as one group to another group or may move one or more blocks designated as another group to the one group, on the basis of the monitoring result provided from the monitoring module 250.

For example, when a block in which a reclaim occurs more than expected is detected on the basis of the monitoring result provided from the monitoring module 250, the refresh period imparted in advance may need to be change by the refresh period management module 270. In such a case, as illustrated in FIG. 12, the refresh period management module 270 may move the block B21 designated as the second group G2 to the first group G1. Further, the refresh period management module 270 may move the block B31 and the block B32 designated as the third group G3 to the second group G2 and the first group G1, respectively.

As another example, in accordance with the monitoring result provided from the monitoring module 250 or the check result of a block status check module 280 to be described later, the refreshed period imparted in advance may need to be changed by the refresh period management module 270. In such a case, as illustrated in FIG. 13, the refresh period management module 270 may move the block B11 and the block B12 designated as the first group G1 to the second group G2 and the third group G3, respectively. Also, the refresh period management module 270 may move the block B21 designated as the second group G2 to the third group G3, respectively.

Furthermore, since the time of monitoring the characteristic degradation rate of the plurality of blocks included in the cell array 110 is not limited to a specific time, the group management module 260 may release one or more groups designated before for the plurality of blocks BLK, and may designate the plurality of blocks BLK as new one or more groups, on the basis of the monitoring result or the like provided from the monitoring module 250.

Further, the refresh period management module 270 may change the first refresh period (for example, 3 days) of the first group G1 to a third refresh period (for example, 4 days) different from the first refresh period or may change the second refresh period (for example, 5 days) of the second group G2 to a fourth refresh period (for example, 6 days) different from the second refresh period, on the basis of the monitoring result provided from the monitoring module 250.

In this way, even when there is a change in the operating environment of the storage device 10, during the operation of the storage device 10, by monitoring the characteristic degradation rates of the plurality of blocks as necessary or periodically, it is possible to dynamically and adaptively change the refresh operation policy of the storage device 10 in the changed environment.

Figure 14:
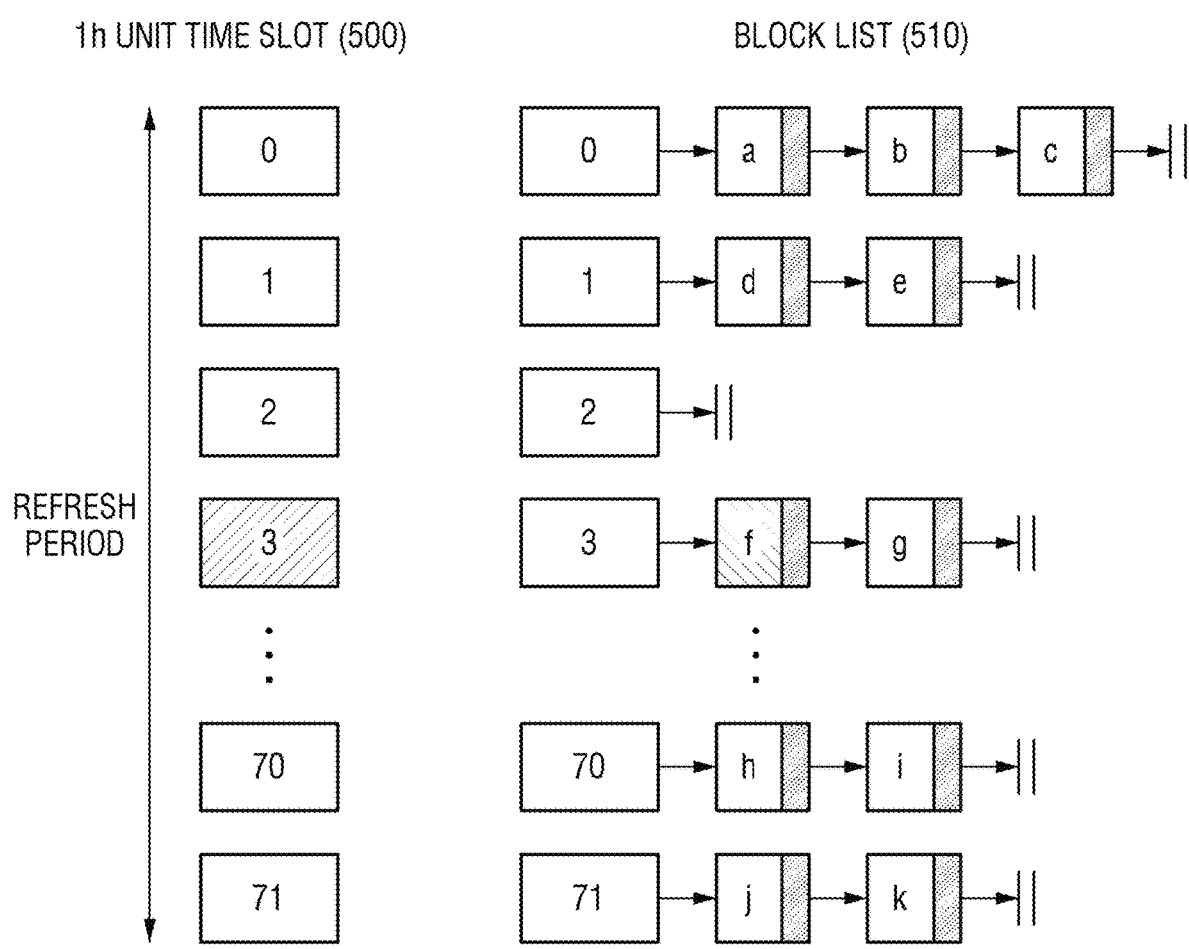
FIG. 14 is a diagram for explaining an operation example of the storage device according to the example embodiment of the present disclosure of FIG. 1.

FIG. 14 is a diagram for explaining an operation example of the storage device according to the example embodiment of the present disclosure of FIG. 1.

In the present disclosure, the refresh period is determined on the basis of the time when the write operation is performed on the block BLK of the cell array 110. In this regard, referring to FIG. 14, an example of a method for managing a plurality of blocks BLK according to a refresh period is illustrated.

For example, in a case where there is a plurality of blocks a to k in which 3 days are defined as the refresh period, when managing the write time separately for each of the plurality of blocks a to k, a large amount of resources of the storage device is occupied, and its performance may be degraded.

In such a case, as illustrated in FIG. 14, a measure of managing the plurality of blocks a to k using the block list 510 corresponding to the time slot 500 of one hour unit may be considered.

Since the refresh period is 3 days, the time slot 500 of one hour unit will contain a total of 72 slots. In the case of the 0th slot, the blocks a, b, c in which the write operation is executed for one hour corresponding to the 0th slot are managed as the 0th list. In the case of the first slot, the blocks d, e in which the write operation is executed for one hour corresponding to the 1st slot is managed as the 1st list. In this manner, in the case of 71st slots, the blocks j, k in which the write operation is executed for one hour corresponding to the 0th slot is managed as the 71st list.

As a result, the processor 210 refreshes the block f included in the 3rd list corresponding to the 3rd slot, thereafter passes through the 4th slot to the 71th slot and the 0th slot to the 2nd slot again, and performs the refresh on the block f included in the 3rd list corresponding to 3rd slot again after 72 hours corresponding to the refresh period.

According to such a scheme, it is possible to easily implement refreshing the corresponding block for each refresh period after the execution of the write operation, without separately maintaining the execution time of the write operation for each block. However, this example embodiment is merely an example of implementation of refresh, and the scope of the present disclosure is not limited thereto.

Figure 15:
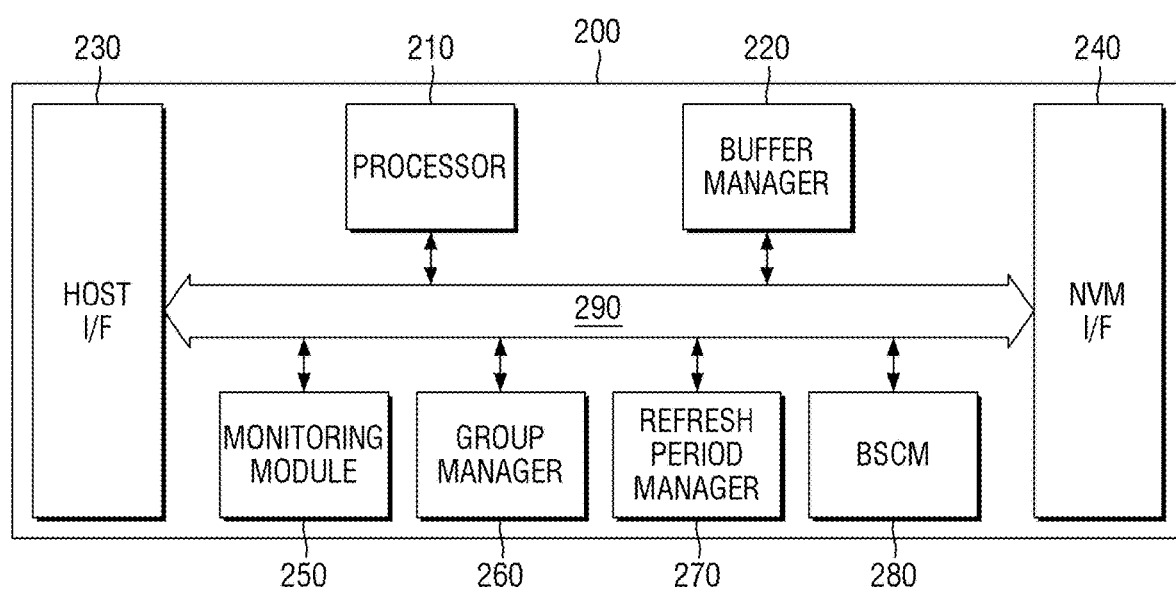
FIG. 15 is a block diagram for explaining a storage device according to another example embodiment of the present disclosure.
Figure 16:
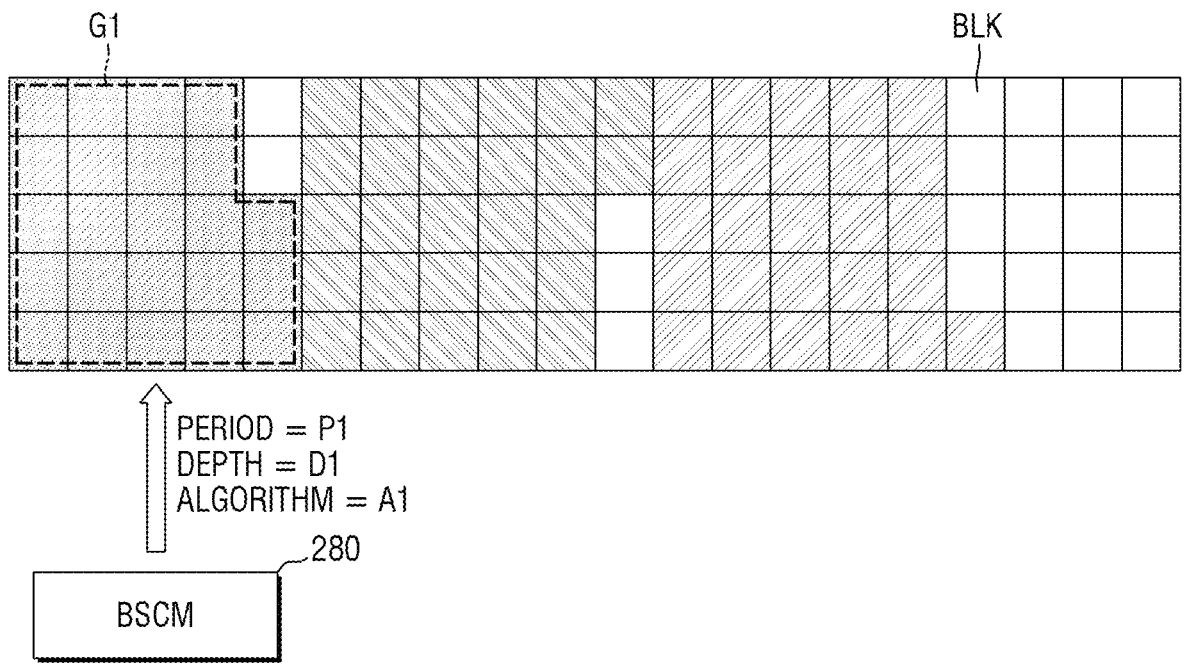
FIGS. 16 to 18 are diagrams for explaining an operation example of the storage device according to another example embodiment of the present disclosure of FIG. 15.
Figure 17:
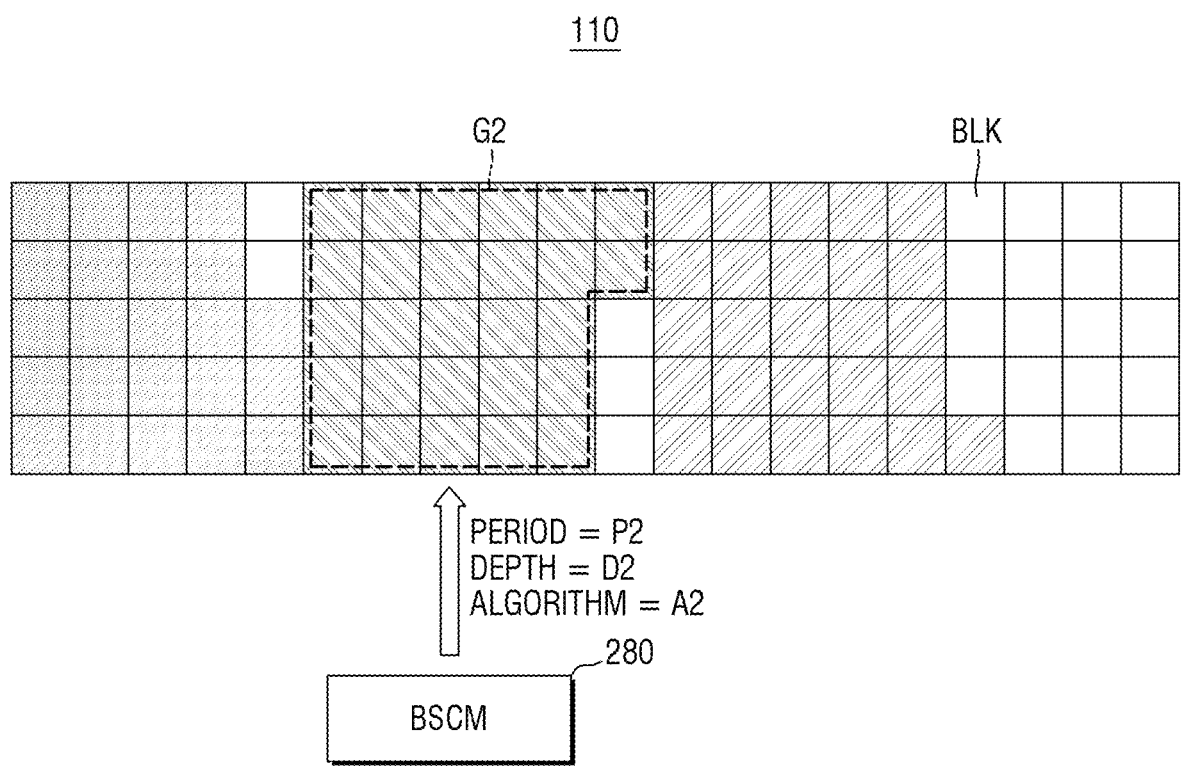
Figure 18:
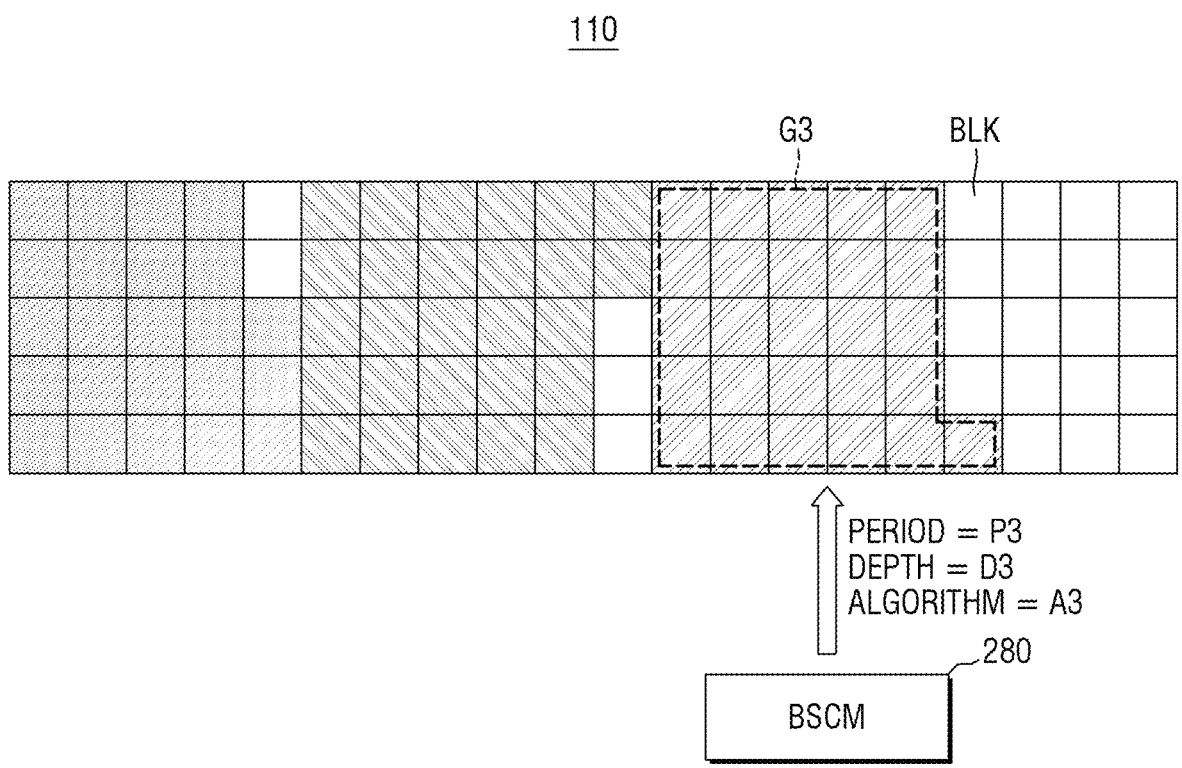

FIG. 15 is a block diagram for explaining a storage device according to another example embodiment of the present disclosure, and FIGS. 16 to 18 are diagrams illustrating an operation example of a storage device according to another example embodiment of the present disclosure of FIG. 15.

Referring to FIG. 15, the difference from the example embodiment of FIG. 3 is that the controller 200 further includes a block status check module 280.

The block status check module 280 checks the status of the plurality of blocks BLK of the cell array 110. In particular, the block status check module 280 checks the status of the plurality of blocks BLK in accordance with a desired (or, alternatively, a predetermined) check policy. Here, the check policy may include at least one of a check period, a check depth and a check algorithm.

In some example embodiments, the block status check module 280 may individually determine the check policy for each of the one or more groups designated by the group management module 260.

Referring to FIGS. 16 to 18, a part of the plurality of blocks BLK included in the cell array 110 may be designated as a first group G1, some others may be designated as a second group G2, and still others may be designated as a third group G3. That is, the group management module 260 may designate the first group G1 to the third group G3 for the plurality of blocks BLK included in the cell array 110.

Next, the block status check module 280 may determine the first check policy for the first group G1, determine the second check policy for the second group G2, and determine the third check policy for the third group G3.

For example, the block status check module 280 determines the check period to P1, the check depth to D1, and the check algorithm to be used to A1 for the first group G1, and may perform the check on the block BLK corresponding to the first group G1. In some example embodiments of the present disclosure, a region recognized as the first group G1 by the block status check module 280 may be the same as a region recognized as the first group G1 by the refresh period management module. In other words, the block status check module 280 may differentiate the policy check of the group designated in accordance with the refresh period.

Similarly, the block status check module 280 determines the check period to P2, the check depth to D2, and the check algorithm to be used to A2 for the second group G2, and may perform the check on the block BLK corresponding to the second group G2 accordingly. In some example embodiments of the present disclosure, a region recognized as the second group G2 by the block status check module 280 may be the same as a region recognized as the second group G2 by the refresh period management module 270. In other words, the block status check module 280 may differentiate the policy check on the group designated in accordance with the refresh period.

Similarly, the block status check module 280 determines the check period to P3, the check depth to D3, and the check algorithm to be use to A3 for the third group G3, and may perform the check on the third group BLK corresponding to the third group G3 accordingly. In some example embodiments of the present disclosure, a region recognized as the third group G3 by the block status check module 280 may be the same as a region recognized as the third group G3 by the refresh period management module 270. In other words, the block status check module 280 may differentiate the policy check on the group designated in accordance with the refresh period.

Figures 19, 20:
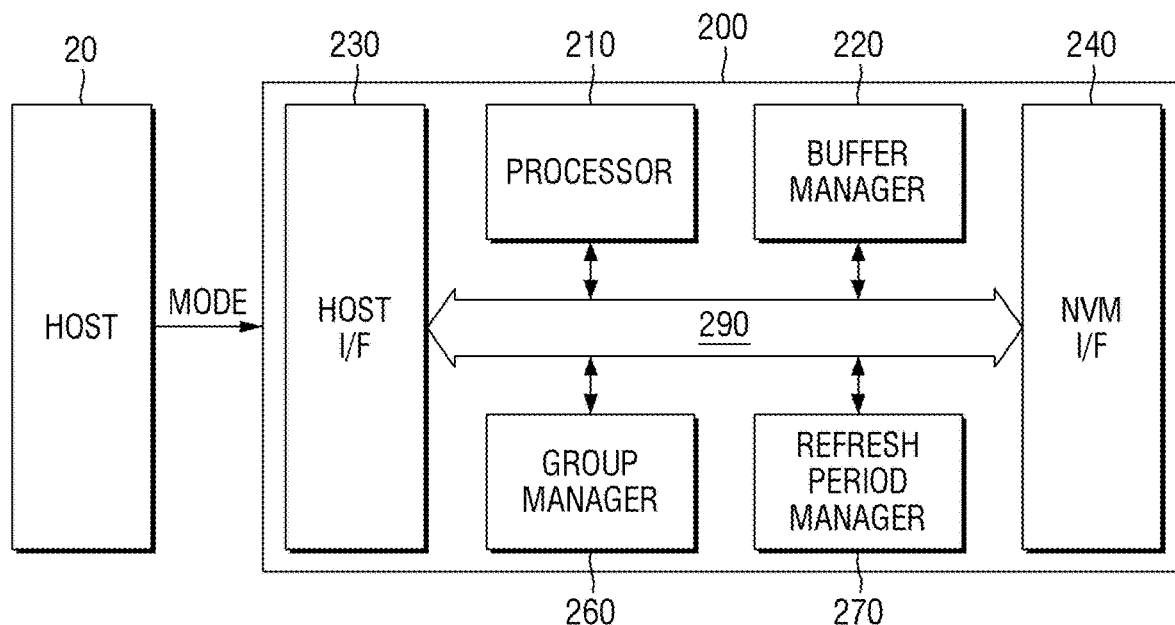
FIG. 19 is a block diagram for explaining a storage device according to another example embodiment of the present disclosure.
FIG. 20 is a diagram for explaining an operation example of the storage device according to another example embodiment of the present disclosure in FIG. 19.

FIG. 19 is a block diagram for explaining a storage device according to another example embodiment of the present disclosure, and FIG. 20 is a diagram for explaining an operation example of a storage device according to another example embodiment of the present disclosure of FIG. 19.

Referring to FIG. 19, the difference from the embodiment of FIG. 3 is that the controller 200 does not include the monitoring module 250 and the storage device 10 receives the operation mode information MODE from the host 20.

Specifically, the storage device 10 receives the operation mode information MODE from the host 20 via the host interface 230, and in accordance with the group configuration policy and the refresh period policy which are set (or, alternatively, preset) according to the operation mode information MODE, the group management module 260 designates a plurality of blocks BLK as one or more groups, and the refresh period management module 270 may determine the refresh period for each of one or more groups.

Next, referring to FIG. 20, for example, when the operation mode information MODE received from the host 20 has a first value (for example, 1), the group management module 260 may designate a plurality of blocks BLK as one group, and the refresh period management module 270 may determine the refresh period of the group as one day.

As another example, when the operation mode information MODE received from the host 20 has a fourth value (for example, 4), the group management module 260 designates the plurality of blocks BLK as 5 groups, and the refresh period management module 270 may determine the refresh period of each of the five groups as 1, 3, 5, 7 and 9 days.

Figure 21:
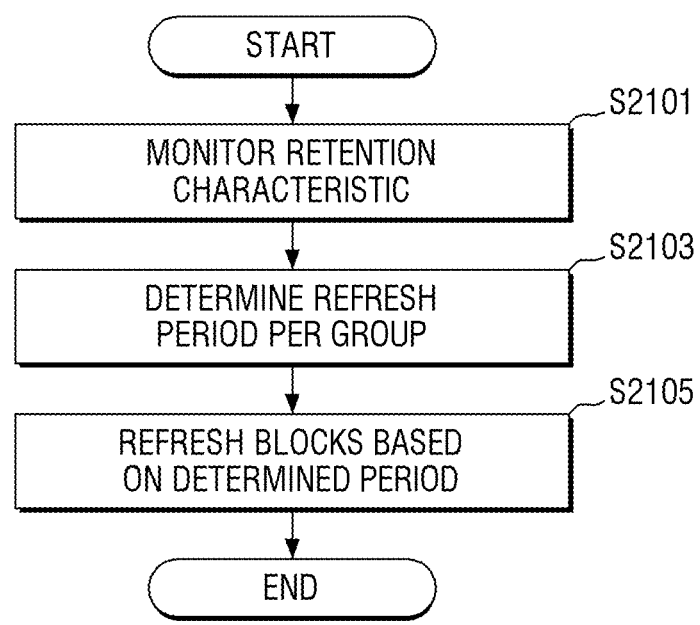
FIG. 21 is a flowchart for explaining a method for operating a storage device according to an example embodiment of the present disclosure.

FIG. 21 is a flowchart for explaining a method for operating a storage device according to an example embodiment of the present disclosure.

Referring to FIG. 21, a method for operating a storage device according to an example embodiment of the present disclosure includes monitoring (S2101) a characteristic degradation rate of a plurality of blocks BLK included in the cell array 110 of the nonvolatile memory 100, designating (S2103) a plurality of blocks BLK as one or more groups on the basis of the monitoring result and determining refresh periods of each of one or more groups, and performing (S2105) a refresh on one or more groups in accordance with the determined refresh periods.

In some example embodiments of the present disclosure, monitoring of the characteristic degradation rate of the plurality of blocks BLK may include monitoring of the degree of degradation of the retention characteristics of the plurality of blocks BLK.

In some example embodiments of the present disclosure, designating of a plurality of blocks BLKs as one or more groups may include designating the plurality of blocks BLKs as one or more groups on the basis of the difference in characteristic degradation rate occurring among a plurality of blocks BLK with the lapse of time.

In some embodiments of the present disclosure, one or more groups includes a first group and a second group, and designating of a plurality of blocks BLK as one or more groups may include designating a block having a characteristic degradation rate determined to be refreshed after lapse of one hour as the first group among plurality of blocks BLK, and designating a block having a characteristic degradation rate determined to be refreshed after lapse of a second time different from the first time as a second group among the plurality of blocks BLK.

In some example embodiments of the present disclosure, designating the plurality of blocks BLK as one or more groups may include releasing one or more groups designated (or, alternatively, predesignated) for the plurality of blocks BLK, and designating the plurality of blocks BLK as new one or more groups in accordance with the monitoring result.

In some example embodiments of the present disclosure, one or more groups include a first group and a second group, and when the characteristic degradation rate of one or more blocks BLK designated as a first group among a plurality of blocks BLK is higher than the characteristic degradation rate of one or more blocks BLK designated as the second group among plurality of blocks BLK, determining of the refresh period of each of one or more groups may include determining a first refresh period and a second refresh period for the first group and the second group such that the first refresh period is shorter than the second refresh period.

In some example embodiments of the present disclosure, determining of the refresh period of each of one or more groups may include changing a first refresh period of the first group to a third refresh period different from the first refresh period or changing the second refresh period of the second group to a fourth refresh period different from the second refresh period, on the basis of the monitoring results provided from the monitoring module 250.

In some example embodiments of the present disclosure, determining of the refresh period for each of the one or more groups may include moving one or more blocks designated as the first group BLK to the second group, or moving one or more blocks BLK designated as the second group to the first group, on the basis of the monitoring result provided from the monitoring module 250.

In some example embodiments of the present disclosure, the method may further include individually determining check policies for each of the one or more groups designated by the group management module 260 to check the status of the plurality of blocks BLK.

In some embodiments of the present disclosure, each of the check policies may include at least one of a check period, a check depth and a check algorithm.

In some example embodiments of the present disclosure, the method further includes receiving operating mode information MODE from the host 20 via the host interface 230, designating the plurality of blocks BLK as one or more groups includes designating the plurality of blocks BLK as one or more groups on the basis of the group configuration policy preset in accordance with the operation mode information MODE, and determining the refresh period for each of one or more groups may include determining the refresh period of each of one or more groups in accordance with the refresh period policy preset in accordance with the operation mode information MODE.

According to various example embodiments of the present disclosure explained above, since the refresh operation of the blocks included in the cell array 110 is performed separately for each group in accordance with the clear criteria, it is possible to obtain the effect of timely dispersing overhead due to the refresh operation, while stably executing the refresh operation. This makes it possible to avoid performance degradation of the storage device 10 caused by the refresh operation, and to ensure the stable operation of the storage device 10.

Furthermore, since the time of monitoring the characteristic degradation rate of the plurality of blocks included in the cell array 110 is not limited to a specific time, even when there is a change in the operating environment of the storage device 10, during operation of the storage device 10, by monitoring the characteristic degradation rate of the plurality of blocks as necessary or periodically, it is possible to dynamically and adaptively change the refresh operation policy of the storage device 10 in the changed environment. Therefore, the effect of improving the performance of the storage device 10 may also be obtained.

In concluding the detailed description, those skilled in the art will appreciate that many variations and modifications may be made to the example embodiments without substantially departing from the principles of the present disclosure. Therefore, the disclosed example embodiments of the disclosure are used in a generic and descriptive sense only and not for purposes of limitation.

What is claimed is:

1. A method for operating a storage device, the method comprising
monitoring characteristic degradation rates of a plurality of blocks included in a cell array of a nonvolatile memory to generate a monitoring result;
designating the plurality of blocks into groups based on the monitoring result;
determining refresh periods for each of the groups;
performing refresh on the groups in accordance with the determined refresh periods;
continually monitoring the characteristic degradation rates of the plurality of blocks to update the monitoring result; and
moving one or more blocks of plurality of blocks between the groups based on the monitoring result.

2. The method of claim 1, wherein the monitoring the characteristic degradation rates of the plurality of blocks comprises monitoring a degree of degradation of retention characteristics of the plurality of blocks.

3. The method of claim 1, wherein the designating of the plurality of blocks as the groups comprises designating the plurality of blocks as the groups on based on a difference in characteristic degradation rate occurring among the plurality of blocks with lapse of time.

4. The method of claim 1, wherein the groups comprise a first group and a second group, and
the designating of the plurality of blocks as the groups comprises:
designating a block having a characteristic degradation rate determined to be refreshed after lapse of a first time among the plurality of blocks, as the first group, and
designating a block having a characteristic degradation rate determined to be refreshed after lapse of a second time different from the first time among the plurality of blocks, as a second group.

5. The method of claim 1, wherein the designating the plurality of blocks as the groups comprises:
releasing one or more prior groups previously designated to the plurality of blocks, and
designating the plurality of blocks as one or more new groups in accordance with the monitoring result.

6. The method of claim 1, wherein the groups comprise a first group and a second group, and when the characteristic degradation rate of one or more blocks designated as the first group among the plurality of blocks is higher than the characteristic degradation rate of one or more blocks designated as the second group among the plurality of blocks, the determining the refresh periods for each of the groups comprises:
determining a first refresh period and a second refresh period on the first group and the second group such that the first refresh period is shorter than the second refresh period.

7. The method of claim 6, wherein the determining the refresh periods for each of the groups comprises:
changing the first refresh period of the first group to a third refresh period different from the first refresh period or changing the second refresh period of the second group to a fourth refresh period different from the second refresh period, based on the monitoring result.

8. The method of claim 6, wherein the determining the refresh periods for each of the groups comprises:
moving one or more blocks designated as the first group to the second group, or moving one or more blocks designated as the second group to the first group, based on the monitoring result.

9. The method of claim 1, further comprising:
individually determining check policies for each of the groups designated to check statuses of the plurality of blocks.

10. The method of claim 9, wherein each of the check policies comprises at least one of a check period, a check depth and a check algorithm.

11. The method of claim 1, further comprising:
receiving operating mode information from a host via a host interface,
wherein the designating the plurality of blocks as the groups comprises designating the plurality of blocks as groups based on a group configuration policy set in advance in accordance with the operating mode information, and
the determining the refresh periods for each of the groups comprises determining the refresh periods for each of the groups based on a refresh period policy set in advance in accordance with the operating mode information.

* * * * *